(12) United States Patent
Agrawal

(10) Patent No.: US 8,484,008 B2
(45) Date of Patent: Jul. 9, 2013

(54) METHODS AND SYSTEMS FOR PERFORMING TIMING SIGN-OFF OF AN INTEGRATED CIRCUIT DESIGN

(75) Inventor: Rajkumar Agrawal, Bangalore (IN)

(73) Assignee: LSI Corporation, San Jose, CA (US)

( * ) Notice: Subject to any disclaimer, the term of this patent is extended or adjusted under 35 U.S.C. 154(b) by 402 days.

(21) Appl. No.: 12/901,588

(22) Filed: Oct. 11, 2010

(65) Prior Publication Data

US 2012/0089383 A1    Apr. 12, 2012

(51) Int. Cl.
G06F 17/50    (2006.01)
G06F 9/44    (2006.01)

(52) U.S. Cl.
USPC .................. 703/14; 703/2; 716/100; 716/104

(58) Field of Classification Search
USPC .................. 703/14, 2; 716/100, 104
See application file for complete search history.

(56) References Cited

U.S. PATENT DOCUMENTS

| | | | |
|---|---|---|---|
| 6,604,227 B1 * | 8/2003 | Foltin et al. | 716/104 |
| 6,954,915 B2 | 10/2005 | Batchelor | |
| 7,178,120 B2 | 2/2007 | Hieter et al. | |
| 7,216,317 B2 | 5/2007 | Sripada | |
| 7,328,415 B2 | 2/2008 | Bou-Ghazale et al. | |
| 7,493,580 B2 * | 2/2009 | Horita | 716/100 |
| 7,937,256 B2 * | 5/2011 | Tseng et al. | 703/14 |
| 8,160,858 B2 * | 4/2012 | Tseng et al. | 703/14 |
| 2003/0237067 A1 | 12/2003 | Mielke et al. | |
| 2007/0204247 A1 * | 8/2007 | Horita | 716/6 |
| 2008/0133202 A1 * | 6/2008 | Tseng et al. | 703/14 |
| 2011/0087478 A1 * | 4/2011 | Tseng et al. | 703/14 |

* cited by examiner

Primary Examiner — Thai Phan
(74) Attorney, Agent, or Firm — Mendelsohn, Drucker & Associates, P.C.; Steve Mendelsohn

(57) ABSTRACT

Systems and methods for performing timing sign-off of an integrated circuit design are disclosed. In one example embodiment the integrated circuit design is divided into plurality of blocks based on a pre-determined logic. A timing model is extracted for each block using static timing analysis (STA), wherein the extracted timing model includes timing information. An integrated circuit design level STA is performed using the extracted timing model of all of the plurality of blocks to obtain first integrated circuit design timing. The first integrated circuit timing is compared with a predetermined performance criterion.

18 Claims, 3 Drawing Sheets

METHODS AND SYSTEMS FOR PERFORMING TIMING SIGN-OFF OF AN INTEGRATED CIRCUIT DESIGN

BACKGROUND

Integrated circuits are electrical circuits that arrange transistors, resistors, capacitors, and other components on a single semiconductor die or substrate, upon which the various components are interconnected to perform a variety of functions. Typical examples of integrated circuits include, for example, microprocessors, programmable-logic devices (PLDs), electrically-erasable-programmable-read-only memory devices (EEPROMs), random-access-memory (RAM) devices, operational amplifiers, voltage regulators, etc.

Often, circuit designs are simulated by computer to verify functionality and timing to ensure that performance goals will be satisfied. Design and circuit analysis procedures are often performed using electronic-computer-aided design (E-CAD) tools. The design and subsequent simulation of a printed circuit, a very large scale integration (VLSI) circuit, or other electrical devices via E-CAD tools allow a product design to be confirmed, and often eliminates a need for building a prototype. Thus, E-CAD tools may enable a VLSI circuit manufacturer to bypass costly and time consuming prototype construction and performance verification stages in a product development process.

BRIEF DESCRIPTION OF THE DRAWINGS

Various embodiments are described herein with reference to the drawings, wherein.

The drawings described herein are for illustration purposes only and are not intended to limit the scope of the present disclosure in any way.

DETAILED DESCRIPTION

A system and method for performing timing sign-off of an integrated circuit design is disclosed. In the following detailed description of the embodiments of the present subject matter, reference is made to the accompanying drawings that form a part hereof, and in which are shown by way of illustration specific embodiments in which the present subject matter may be practiced. These embodiments are described in sufficient detail to enable those skilled in the art to practice the present subject matter, and it is to be understood that other embodiments may be utilized and that changes may be made without departing from the scope of the present subject matter. The following detailed description is, therefore, not to be taken in a limiting sense, and the scope of the present subject matter is defined by the appended claims.

Figure 1:
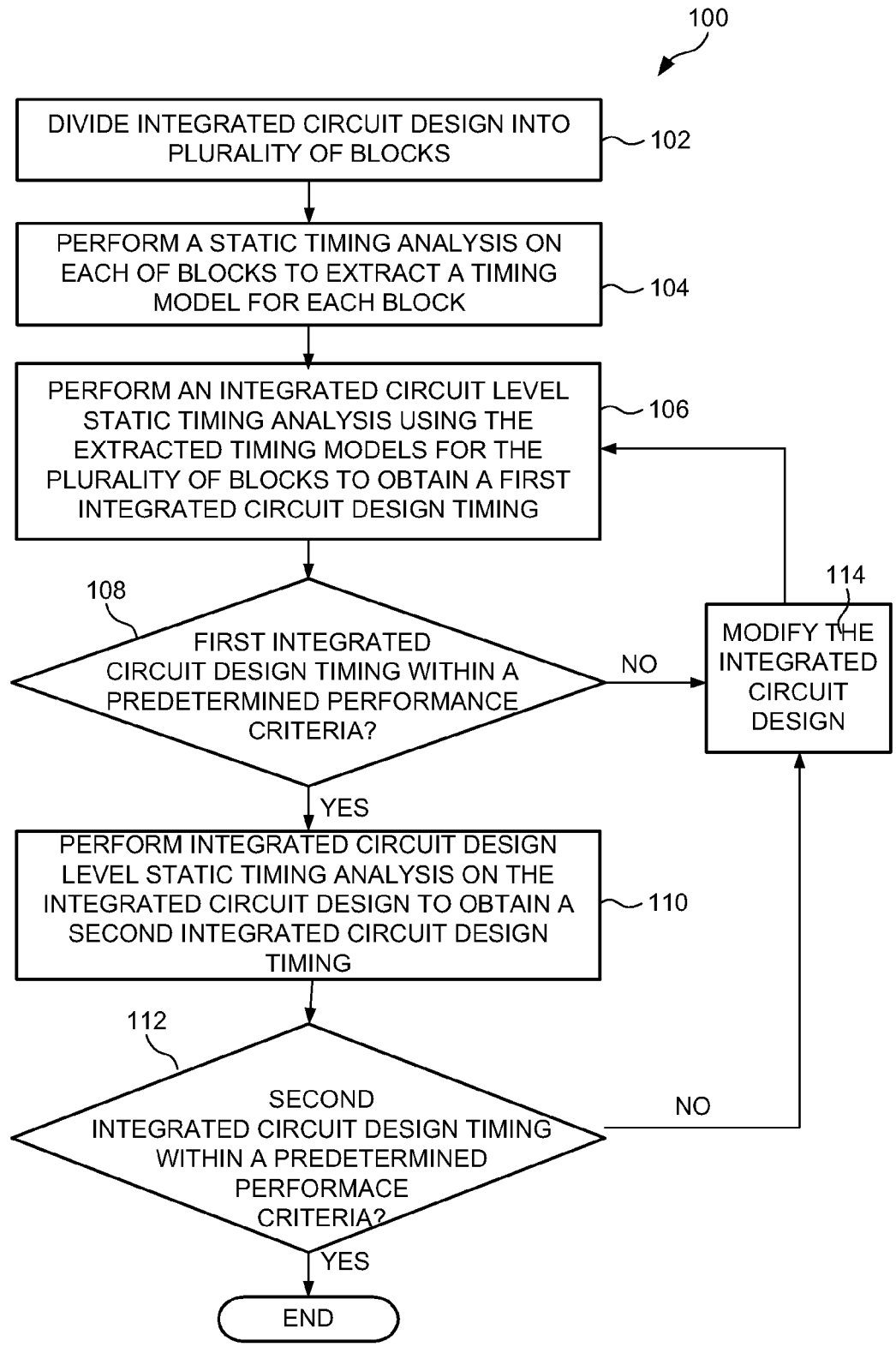
FIG. 1 illustrates a flow diagram of a method for performing timing sign-off of an integrated circuit design, according to an embodiment.

FIG. 1 illustrates a flow diagram 100 of an exemplary method for performing timing sign-off of an integrated circuit design, according to an embodiment. With increasing number of gate counts in integrated circuits, concept of hierarchical design has caught the trend. As virtue of the hierarchical design, an integrated circuit may be divided into various hierarchical blocks and may be implemented independently. Each hierarchical block is then integrated to represent the integrated circuit. The integrated circuit design may be arranged and modeled with a plurality of separately defined blocks arranged and coupled in a hierarchical fashion across the integrated circuit design. According to an embodiment, the method for performing the timing sign-off of the integrated circuit design described herein with respect to FIG. 1 may be implemented using a general purpose computer system.

At step 102, the integrated circuit design is divided into a plurality of blocks. The integrated circuit design may be divided into a plurality of hierarchical blocks. The integrated circuit design may be divided into the plurality of blocks based on a predetermined logic. According to an embodiment, the integrated circuit design may be divided into the plurality of blocks of substantially equal sizes. According to another embodiment, the integrated circuit design may be divided into the plurality of blocks of equal sizes based on a circuitry logic and/or functional logic. The integrated circuit design may be divided into the plurality of blocks using a programmed general purpose computer system. As an example the integrated circuit design may be divided into plurality of blocks using a computer program stored in the computer system.

At step 104, static timing analysis (STA) is performed on each of the blocks to extract a timing model. The timing model for a block may provide a representation of an internal processing time within an originating block, a representation of signal delay time from a source block to a destination block, a signal delay time from the destination block to higher level circuit blocks (e.g., blocks BA and BB at shown in FIG. 2), as well as an internal processing time within a final destination circuit block. The STA of the blocks may be performed independent of the integrated circuit design. Each block of the plurality of the blocks of the integrated circuit design may be subjected to a timing analysis to obtain a timing performance. According to an embodiment, the STA may be performed on the blocks during a design phase of the blocks. The STA may be performed on the blocks using the programmed general purpose computer. The STA may be performed over a multitude of paths that couple the plurality of blocks which together define the integrated circuit design.

At step 106, an integrated circuit design level STA is performed using the extracted timing model for the plurality of blocks to obtain a first integrated circuit design timing. The integrated circuit design level STA is performed to obtain the first integrated circuit design timing by using the timing models of the plurality of the blocks of the integrated circuit design. The first integrated circuit design timing may include an input delay, an output delay, an input transition, a maximum input capacitance, an output capacitive load, and a maximum output transition. The integrated circuit design level STA of step 106, may be performed using the programmed general purpose computer system. By using the timing models of the plurality of blocks, the overall time required for performing the integrated circuit design level STA is reduced significantly. The use of the timing models for the plurality of blocks also reduces the complexity of computation of the first integrated circuit design timing.

At step 108, it is determined whether the first integrated circuit design timing is within predetermined performance criteria. The predetermined performance criteria may be determined by a system administrator and/or user. The predetermined performance criteria may be determined based on a timing constraint of the integrated circuit design. If the first integrated circuit design timing is not within the predetermined performance criteria, the integrated circuit design may be modified at step 114. The integrated circuit design level STA may be performed on the modified integrated circuit design using the extracted timing model for the plurality of blocks to obtain the first integrated circuit design timing. The steps 106, 108 and 114 may be repeated until the first integrated circuit design timing is within the predetermined performance criteria.

At step 110, if the first integrated circuit design timing is within the predetermined performance criteria, an integrated circuit design level STA is performed on the integrated circuit design to obtain a second integrated circuit design timing. The second integrated circuit design timing may also be obtained by performing the integrated circuit design level STA on a netlist of the integrated circuit design. The netlist for the integrated circuit design may be obtained by using the programmed general purpose computer. The integrated circuit design level STA performed to obtain the second integrated circuit design timing is performed on the actual integrated circuit design without using the timing models of the plurality of the blocks of the integrated circuit design. The time required to perform the integrated circuit design level STA to obtain the second integrated circuit design timing may be more than time required to perform the integrated circuit design level STA to obtain the first integrated circuit design timing. The second integrated timing may represent the timing of entire integrated circuit design.

At step 112, it is determined whether the second integrated circuit design timing is within the predetermined performance criteria. The predetermined performance criteria may be defined for the integrated circuit design. The predetermined performance criteria may be defined by a user. If the second integrated circuit design level timing is not within the predetermined performance criteria, the previous integrated circuit design may be modified at step 114 to produce another modified integrated circuit design. The integrated circuit design level STA may be performed again using the extracted timing models for the plurality of blocks to obtain the first integrated circuit design timing. The steps 106, 108, 110, 112 and 114 are repeated until the second integrated circuit design timing is under the predetermined performance criteria.

Figure 2:
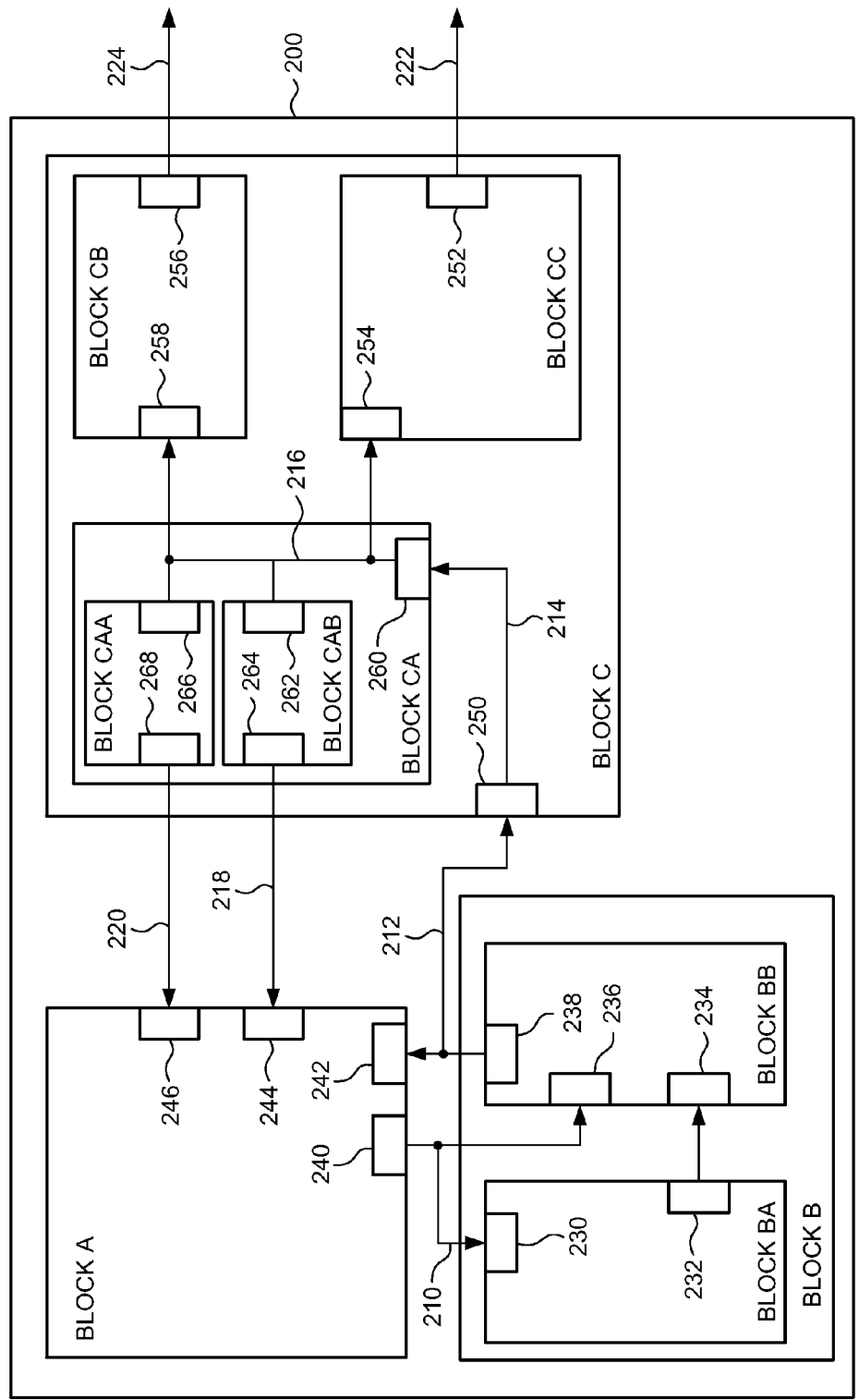
FIG. 2 illustrates a block diagram representing the integrated circuit design divided into a plurality of blocks, according to an embodiment.

FIG. 2 illustrates a block diagram representing an integrated circuit design 200 divided into plurality of blocks, according to an embodiment. The integrated circuit design 200 may be generated via the programmed general purpose computer. The integrated circuit design 200 illustrated in FIG. 2 is grossly oversimplified for ease of illustration and discussion of aspects pertinent to the scope of the disclosure. It should be understood that, the integrated circuit design may contain tens to hundreds of millions of transistors and other various functional components. It should be further understood that the integrated circuit at that level of integration may be designed by individual circuit designers and/or by teams of circuit designers tasked with developing component arrangements to meet various functional and timing specifications. Thus, the blocks may be assigned to various circuit designers or teams to design separate portions of the integrated circuit.

In this regard, the integrated circuit design 200 includes a plurality of blocks labeled, A, B, and C. The blocks A, B, and C may each contain circuitry configured to perform one or more designated functions for one or more time varying input signals. The blocks A, B, and C may also be configured with appropriate conductors to forward output signals to each other and in some cases to destinations other than those on the integrated circuit design 200. The blocks A, B, and C are representative of a first level of the overall integrated circuit design 200.

The blocks may both receive and/or send time varying signals to or from other blocks via various conductors. These input and output signals may traverse the blocks at a same hierarchical level (e.g., the first, second, and third levels, respectively), as well as traverse different hierarchical levels (e.g., between the third and the first levels). For example, a conductor 210 connects the block A with the block B at a first hierarchical level. The block B is also coupled to blocks BA and BB at a second hierarchical level. Conversely, a conductor 220 connects a block CAA with the block A, thus coupling a third hierarchical level to the first hierarchical level.

For simplicity of illustration and description, the integrated circuit design 200 omits respective ports at an intersection of conductors and a border of each block at each hierarchical level. For example, ports are not illustrated at the intersection of a block CA and the block C. It should be understood, that each block can be modeled by the conductors (inputs and outputs) that traverse the border of the block at one or more hierarchical levels. In other words, a conductor 218 may be modeled by adding both an input and an output port within the block CA and an input and an output port within the block C in addition to a port 264 and a port 244.

The integrated circuit design 200 of FIG. 2 illustrates three levels of hierarchy. It should be understood that more or fewer levels of hierarchy are contemplated and may be modeled and analyzed in the contemplated system.

At one level of abstraction, the block A may be modeled by an output port 240 and inputs ports 242, 244, and 246, and various internal circuits (not shown) that may be coupled to the ports. As illustrated in FIG. 2, each of the separate ports 240, 242, 244, and 246 may be modeled at the interface of the block A. Similarly, the block B can be modeled by an input port 230 and an output port 238 and various internal circuits (not shown) that may be coupled to the ports. In addition, the block B can be modeled at a second level of abstraction that may account for an output port 232, input ports 234 and 236, as well as the various internal circuits of blocks BA and BB, respectively. It should be understood that the block C, among other blocks not illustrated, can be similarly represented at various levels of abstraction.

According to an embodiment, with reference to FIG. 2, once a design team assigned to the block BA receives an indication of when the signal that originated in the block A will arrive at the block BA, the design team will be able to determine with greater certainty if the proposed design for the internal circuitry of the block A will result in the signal arriving at the destination register within the block BA within a predetermined time. The time at which the signal traverses the border of the block A relative to a clock cycle is important as it may impact the integrated circuit design functions in blocks BA and BB. Relative clock cycle positions may be used as timing constraints for distribution across the various blocks of the integrated circuit design 200. A number of signal-timing parameters may be applied to each of the plurality of blocks of the integrated circuit design. For example, each block may further be described by an input delay, an output delay, an input transition, a maximum input capacitance, an output capacitive load, and a maximum output transition.

Figure 3:
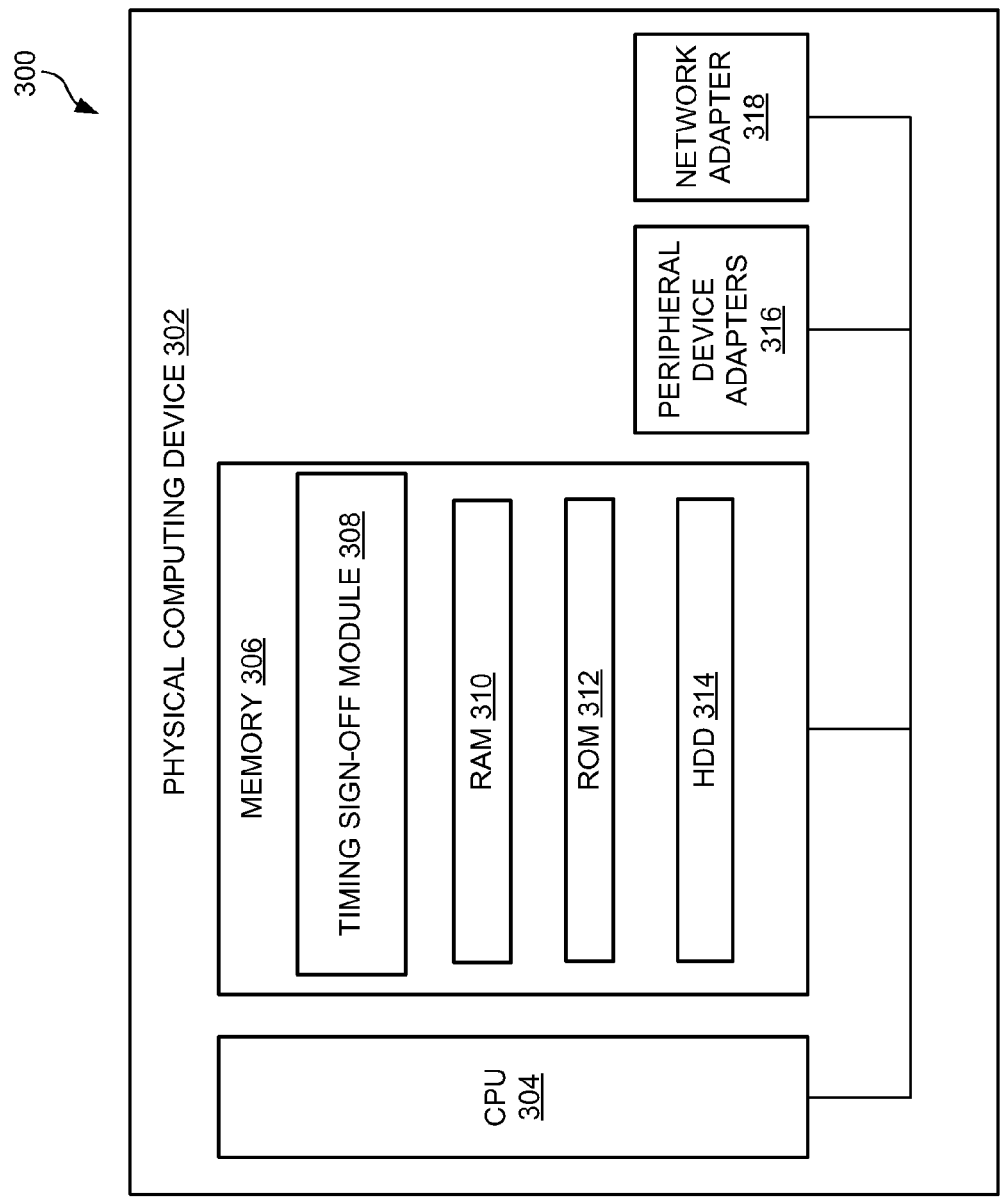
FIG. 3 illustrates a block diagram of a system for performing the timing sign-off of the integrated circuit design using a timing sign-off module, according to one embodiment.

FIG. 3 illustrates a block diagram 300 of a system for performing the timing sign-off of the integrated circuit design using a timing sign-off module (308), according to one embodiment. Referring now to FIG. 3, the system for performing the timing sign-off of the integrated circuit design includes a physical computing device (302). The physical computing device (302) of the present example is a computing device configured to performing the timing sign-off of the integrated circuit design by dividing the integrated circuit design into plurality of blocks. Illustrative processes of performing the timing sign-off of the integrated circuit design will be set forth in more detail below.

To achieve its desired functionality, the physical computing device (302) includes various hardware components. Among these hardware components may be at least one central processing unit (CPU) (304), at least one memory unit (306) and peripheral device adapters. These hardware components may be interconnected through use of one or more busses and/or network connections.

The CPU (304) may include hardware architecture necessary to retrieve executable code from the memory unit (306) and execute the executable code. The executable code may, when executed by the CPU (304), causes the processing unit (304) to implement at least the functionality of performing the timing sign-off of the integrated circuit design. In the course of executing code, the CPU (304) may receive input from and provide output to one or more of the remaining hardware units.

The memory unit (306) may be configured to digitally store data consumed and produced by the CPU (304). Further, the memory unit (306) includes a timing sign-off module (308). The memory unit (306) may also include various types of memory modules, including volatile and nonvolatile memory. For example, the memory unit (306) of the present example includes Random Access Memory (RAM) 310, Read Only Memory (ROM) 312, and Hard Disk Drive (HDD) memory 314. Many other types of memory are available in the art, and the present specification contemplates the use of any type(s) of memory in the memory unit (306) as may suit a particular application of the principles described herein. In certain examples, different types of memory in the memory unit (306) may be used for different data storage needs. For example, in certain embodiments the CPU (304) may boot from the ROM 312, maintain nonvolatile storage in the HDD memory 314, and execute program code stored in the RAM 310.

The hardware adapter in the physical computing device (302) are configured to enable the CPU (304) to interface with various other hardware elements, external and internal to the physical computing device (302). For example, peripheral device adapters (316) may provide an interface to input/output devices to create a user interface and/or access external sources of memory storage. The peripheral device adapters (316) may also create an interface between the CPU (304) and a printer or other media output device.

The above described embodiments with respect to FIG. 3 are intended to provide a brief, general description of a suitable computing environment in which certain embodiments of the inventive concepts contained herein may be implemented.

As shown, the timing sign-off module 308 in the memory (306) performs the timing sign-off of the integrated circuit design. For example, the timing sign-off module (308) described above may be in the form of instructions stored on a non-transitory computer-readable storage medium. An article includes the non-transitory computer-readable storage medium having the instructions that, when executed by the physical computing device (302), causes the computing device (302) to perform the one or more methods described with respect to FIG. 1.

In various embodiments, the above mentioned methods and systems described in FIGS. 1 through 3 are easy to implement. According to an embodiment, the methods described in FIGS. 1 through 3 provide an improved method of constraint derivation where automation is independent of hierarchical block size and without any changes to time budgeting factor. The methods described in FIGS. 1 through 3 also provide a mechanism to perform the timing signoff in hierarchical chip design with accuracy and less turn-around time. Furthermore, the methods described in FIGS. 1 through 3 provide a mechanism to perform the timing sign-off by using a timing extracted model during initial phases of a chip timing analysis and a flat netlist during final phases of the chip timing analysis.

Although the present embodiments have been described with reference to specific example embodiments, it will be evident that various modifications and changes may be made to these embodiments without departing from the broader spirit and scope of the various embodiments. Furthermore, the various devices, modules, analyzers, generators, and the like described herein may be enabled and operated using hardware circuitry, for example, complementary metal oxide semiconductor based logic circuitry, firmware, software and/or any combination of hardware, firmware, and/or software embodied in a machine readable medium. For example, the various electrical structure and methods may be embodied using transistors, logic gates, and electrical circuits, such as application specific integrated circuit design.

What is claimed is:

1. A method of performing timing sign-off of an integrated circuit design, comprising:
    (a) dividing the integrated circuit design into a plurality of blocks;
    (b) extracting a timing model for each block using static timing analysis, wherein the extracted timing model includes timing information independent of remaining blocks;
    (c) integrating the plurality of blocks into the integrated circuit design;
    (d) performing an integrated circuit level static timing analysis on the integrated circuit design using the extracted timing model of each block to obtain a first integrated circuit design timing;
    (e) determining whether the first integrated circuit design timing is within predetermined performance criteria;
    (f) if the first integrated circuit design timing is not within the predetermined performance criteria, then modifying the integrated circuit design by changing the integration of the plurality of blocks in the integrated circuit design and returning to step (d);
    (g) if the first integrated circuit design timing is within the predetermined performance criteria, then performing an integrated circuit level static timing analysis on the integrated circuit design without using the extracted timing model of each block to obtain a second integrated circuit design timing;
    (h) determining whether the second integrated circuit design timing is within the predetermined performance criteria;
    (i) if the second integrated circuit design timing is not within the predetermined performance criteria, then modifying the integrated circuit design by changing the integration of the plurality of blocks in the integrated circuit design and returning to step (d); and
    (j) if the second integrated circuit design timing is within the predetermined performance criteria, then signing off on the timing of the integrated circuit design.

2. The method of claim 1, wherein the integrated circuit design is divided into a plurality of equal size blocks.

3. The method of claim 1, wherein the plurality of blocks are hierarchical blocks.

4. The system of claim 1, wherein the extracted timing model comprises one or more of an input delay, an output delay, an input transition, a maximum input capacitance, an output capacitive loading value, and a maximum output transition.

5. The method of claim 1, wherein the integrated circuit design is modified in steps (f) and (i) without changing design of any of the blocks.

6. The method of claim 1, wherein the integrated circuit level static timing analysis in step (g) is based on a netlist of the integrated circuit design.

7. A system for performing timing sign-off of an integrated circuit design, comprising:
   a processor; and
   a memory operatively coupled to the processor, wherein the memory includes a timing sign-off module for performing the timing sign-off of the integrated circuit design, having instructions capable of causing the processor to perform a method of:
   (a) dividing the integrated circuit design into plurality of blocks based on a pre-determined logic;
   (b) extracting a timing model for each block using static timing analysis, wherein the extracted timing model includes timing information independent of remaining blocks;
   (c) integrating the plurality of blocks into the integrated circuit design;
   (d) performing an integrated circuit level static timing analysis using the extracted timing model of each block to obtain a first integrated circuit design timing; and
   (e) determining whether the first integrated circuit design timing is within predetermined performance criteria;
   (f) if the first integrated circuit design timing is not within the predetermined performance criteria, then modifying the integrated circuit design by changing the integration of the plurality of blocks in the integrated circuit design and returning to step (d);
   (g) if the first integrated circuit design timing is within the predetermined performance criteria, then performing an integrated circuit level static timing analysis on the integrated circuit design without using the extracted timing model of each block to obtain a second integrated circuit design timing;
   (h) determining whether the second integrated circuit design timing is within the predetermined performance criteria;
   (i) if the second integrated circuit design timing is not within the predetermined performance criteria, then modifying the integrated circuit design by changing the integration of the plurality of blocks in the integrated circuit design and returning to step (d); and
   (j) if the second integrated circuit design timing is within the predetermined performance criteria, then signing off on the timing of the integrated circuit design.

8. The system of claim 7, wherein the integrated circuit is divided into the plurality of equal size blocks.

9. system of claim 7, wherein the plurality of blocks are hierarchical blocks.

10. The system of claim 7, wherein:
the plurality of blocks are a first plurality of blocks at a first hierarchical level of a hierarchical integrated circuit;
the first plurality of blocks are part of a larger block at a second hierarchical level of the hierarchical integrated circuit; and
the hierarchical integrated circuit comprises a second plurality of larger blocks at the second hierarchical level.

11. The system of claim 10, wherein:
the method is applied to the first plurality of blocks to integrate the first plurality of blocks into the larger block at the first hierarchical level; and
the method is applied to the second plurality of larger blocks to integrate the second plurality of larger blocks at the second hierarchical level.

12. The system of claim 7, wherein the integrated circuit design is modified in steps (f) and (i) without changing design of any of the blocks.

13. The system of claim 7, wherein the integrated circuit level static timing analysis in step (g) is based on a netlist of the integrated circuit design.

14. A non-transitory computer-readable storage medium for performing timing sign-off for an integrated circuit design, having instructions that, when executed by a computing device, causes the computing device to perform a method comprising:
   (a) dividing the integrated circuit design into plurality of blocks based on a pre-determined logic;
   (b) extracting a timing model for each block using static timing analysis, wherein the extracted timing model includes timing information independent of remaining blocks;
   (c) integrating the plurality of blocks into the integrated circuit design;
   (d) performing an integrated circuit level static timing analysis using the extracted timing model of each block to obtain a first integrated circuit design timing; and
   (e) determining whether the first integrated circuit design timing is within predetermined performance criteria;
   (f) if the first integrated circuit design timing is not within the predetermined performance criteria, then modifying the integrated circuit design by changing the integration of the plurality of blocks in the integrated circuit design and returning to step (d);
   (g) if the first integrated circuit design timing is within the predetermined performance criteria, then performing an integrated circuit level static timing analysis on the integrated circuit design without using the extracted timing model of each block to obtain a second integrated circuit design timing;
   (h) determining whether the second integrated circuit design timing is within the predetermined performance criteria;
   (i) if the second integrated circuit design timing is not within the predetermined performance criteria, then modifying the integrated circuit design by changing the integration of the plurality of blocks in the integrated circuit design and returning to step (d); and
   (j) if the second integrated circuit design timing is within the predetermined performance criteria, then signing off on the timing of the integrated circuit design.

15. The method of claim 1, wherein:
the plurality of blocks are a first plurality of blocks at a first hierarchical level of a hierarchical integrated circuit;
the first plurality of blocks are part of a larger block at a second hierarchical level of the hierarchical integrated circuit; and
the hierarchical integrated circuit comprises a second plurality of larger blocks at the second hierarchical level.

16. The method of claim 15, wherein:
the method is applied to the first plurality of blocks to integrate the first plurality of blocks into the larger block at the first hierarchical level; and
the method is applied to the second plurality of larger blocks to integrate the second plurality of larger blocks at the second hierarchical level.

17. The method of claim 16, wherein:
the first plurality of blocks are of substantially similar size; and
the second plurality of larger blocks are of substantially similar, but larger size.

18. The system of claim 11, wherein:
the first plurality of blocks are of substantially similar size; and
the second plurality of larger blocks are of substantially similar, but larger size.

* * * * *